United States Patent
Zolfaghari

(10) Patent No.: US 7,564,302 B2
(45) Date of Patent: Jul. 21, 2009

(54) METHOD AND SYSTEM FOR GAIN CONTROL AND POWER SAVING IN BROADBAND FEEDBACK LOW-NOISE AMPLIFIERS

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 11/752,025

(22) Filed: May 22, 2007

(65) Prior Publication Data

US 2008/0231357 A1 Sep. 25, 2008

Related U.S. Application Data

(60) Provisional application No. 60/895,698, filed on Mar. 19, 2007.

(51) Int. Cl.
 *H03F 1/14* (2006.01)
(52) U.S. Cl. .................................. 330/51; 330/278
(58) Field of Classification Search .............. 330/51, 330/278, 254, 282
See application file for complete search history.

(56) References Cited

U.S. PATENT DOCUMENTS

| 6,175,278 | B1 * | 1/2001 | Hasegawa | 330/278 |
| 6,405,164 | B1 * | 6/2002 | Pinai | 704/225 |
| 6,828,845 | B2 * | 12/2004 | Pennock et al. | 327/403 |
| 6,882,226 | B2 * | 4/2005 | Cho et al. | 330/282 |
| 7,245,179 | B2 * | 7/2007 | Chang | 330/86 |

* cited by examiner

*Primary Examiner*—Henry K Choe
(74) *Attorney, Agent, or Firm*—McAndrews Held & Malloy, Ltd.

(57) ABSTRACT

Methods and systems for gain control and power saving in broadband feedback low-noise amplifiers are disclosed and may include controlling gain, power and/or a noise figure by selectively enabling one or more of a plurality of gain stages by activating one or more of a plurality of pairs of switching transistors. Each of the gain stages may comprise complementary inverter pairs, with the gain of each of the gain stages binary weighted and stored in a lookup table. A feedback resistance coupled across the gain stages may be adjusted, and may comprise a plurality of individually addressable resistors, with the resistance binary weighted and stored in a lookup table. The adjusting of the feedback resistance may comprise switching one or more of a plurality of switching transistors, each connected in parallel with one of the individually addressable resistors, which may shunt one or more of the individually addressable resistors.

10 Claims, 5 Drawing Sheets

METHOD AND SYSTEM FOR GAIN CONTROL AND POWER SAVING IN BROADBAND FEEDBACK LOW-NOISE AMPLIFIERS

CROSS-REFERENCE TO RELATED APPLICATIONS/INCORPORATION BY REFERENCE

This application makes reference to, claims priority to, and claims the benefit of U.S. Provisional Application Ser. No. 60/895,698, filed on Mar. 19, 2007, which is incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to signal amplification. More specifically, certain embodiments of the invention relate to a method and system for gain control and power saving in broadband feedback low-noise amplifiers.

BACKGROUND OF THE INVENTION

As mobile, wireless, and/or handheld portable devices increasingly become multifunctional, "all-in-one," communication devices, these handheld portable devices integrate an increasingly wide range of functions for handling a plurality of wireless communication services. For example, a single handheld portable device may enable Bluetooth communication, cellular communication and/or wireless local area network (WLAN) communications.

Much of the front end processing for wireless communications services is performed in analog circuitry. Front end processing within a portable device may comprise a range of operations that involve the reception of radio frequency (RF) signals, typically received via an antenna that is communicatively coupled to the portable device. Receiver tasks performed on a received RF signal may include demodulation, filtering, and analog to digital conversion (ADC), for example. Noise considerations may be important since the strength of the received RF signal may be low. The resulting front-end processed signal may be referred to as a baseband signal. The baseband signal typically contains digital data, which may be subsequently processed in digital circuitry within the portable device.

Front end processing within a portable device may also include transmission of RF signals. Transmitter tasks performed on a baseband signal may include digital to analog conversion (DAC), filtering, modulation, and power amplification (PA), for example. The power amplified RF signal is typically transmitted via an antenna that is communicatively coupled to the portable device by some means. The antenna utilized for receiving an RF signal at a portable device may or may not be the same antenna that is utilized for transmitting an RF signal from the portable device.

One limitation in the inexorable march toward increasing integration of wireless communications services in a single portable device is that the analog RF circuitry for each separate wireless communication service may be implemented in a separate integrated circuit (IC) device (or chip). The increasing chip count may limit the extent to which the physical dimensions of the portable device may be miniaturized. Thus, the increasing integration may result in physically bulky devices, which may be less appealing to consumer preferences. The chip count may be further increased due to the need to replicate ancillary circuitry associated with each RF IC. For example, each RF IC may require separate low noise amplifier (LNA) circuitry, separate PA circuitry, and separate crystal oscillator (XO) circuitry for generation of clocking and timing signals within each RF IC. Similar replication may occur for digital IC devices utilized for processing of baseband signals from each separate wireless communication service.

Along with an increasing IC component count, there may also be a corresponding rise in power consumption within the portable device. This may be undesirable due, for example, to increased operating temperature, and reduced battery life between recharges.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for gain control and power saving in broadband feedback low-noise amplifiers, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for gain control and power saving in broadband feedback low-noise amplifiers. Exemplary aspects of the invention may comprise controlling gain, power and/or a noise figure by selectively enabling one or more of a plurality of gain stages by activating one or more of a plurality of pairs of switching transistors. Each of the gain stages may comprise complementary inverter pairs, with the gain of each of the gain stages binary weighted and stored in a lookup table.

A feedback resistance coupled across the gain stages may be adjusted, and may comprise a plurality of individually addressable resistors, with the resistance binary weighted and stored in a lookup table. The adjusting of the feedback resistance may comprise switching one or more of a plurality of switching transistors, each connected in parallel with one of the individually addressable resistors, which may shunt one or more of the individually addressable resistors.

Figure 1:
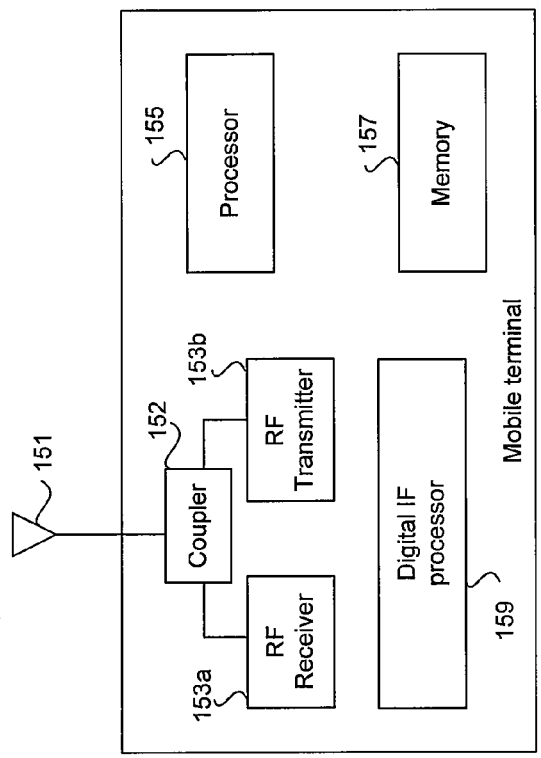
FIG. 1 is a block diagram illustrating an exemplary mobile terminal, which may be utilized in connection with an embodiment of the invention.

FIG. 1 is a block diagram illustrating an exemplary mobile terminal, which may be utilized in connection with an embodiment of the invention. Referring to FIG. 1, there is shown mobile terminal 150 that may comprise an RF receiver 153a, an RF transmitter 153b, a coupler 152, a digital IF processor 159, a processor 155 and a memory 157. An antenna 151 may be communicatively coupled to the coupler 152.

The RF receiver 153a may comprise suitable circuitry, logic, and/or code that may enable processing of received RF signals. The RF receiver 153a may enable receiving of RF signals in frequency bands utilized by various wireless communication systems, such as Bluetooth, FM, WLAN, GSM, and/or WCDMA, for example.

The coupler 152 may comprise suitable circuitry, logic, and/or code that may enable coupling of the RF receiver 153a and the RF transmitter 153b to the antenna 151. In this manner, a single antenna may be utilized for transmitting and receiving RF signals.

The digital IF processor 159 may comprise suitable circuitry, logic, and/or code that may enable processing and/or handling of baseband signals. In this regard, the digital baseband processor 159 may process or handle signals received from the RF receiver 153a and/or signals to be transferred to the RF transmitter 153b for transmission via a wireless communication medium. The digital baseband processor 159 may also provide control and/or feedback information to the RF receiver 153a and to the RF transmitter 153b, based on information from the processed signals. The digital baseband processor 159 may communicate information and/or data from the processed signals to the processor 155 and/or to the memory 157. Moreover, the digital baseband processor 159 may receive information from the processor 155 and/or the memory 157, which may be processed and transferred to the RF transmitter 153b for transmission to the wireless communication medium.

The RF transmitter 153b may comprise suitable circuitry, logic, and/or code that may enable processing of RF signals for transmission. The RF transmitter 153b may enable transmission of RF signals in frequency bands utilized by various wireless communications systems, such as Bluetooth, Zigbee, FM, WLAN, WiMax, GSM and/or WCDMA, for example.

The processor 155 may comprise suitable circuitry, logic, and/or code that may enable control and/or data processing operations for the mobile terminal 150. The processor 155 may be utilized to control at least a portion of the RF receiver 153a, the RF transmitter 153b, the digital baseband processor 159, and/or the memory 157. In this regard, the processor 155 may generate at least one signal for controlling operations within the mobile terminal 150.

The memory 157 may comprise suitable circuitry, logic, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal 150. For example, the memory 157 may comprise information necessary to configure the RF receiver 153a to enable receiving RF signals in the appropriate frequency band.

Figure 2:
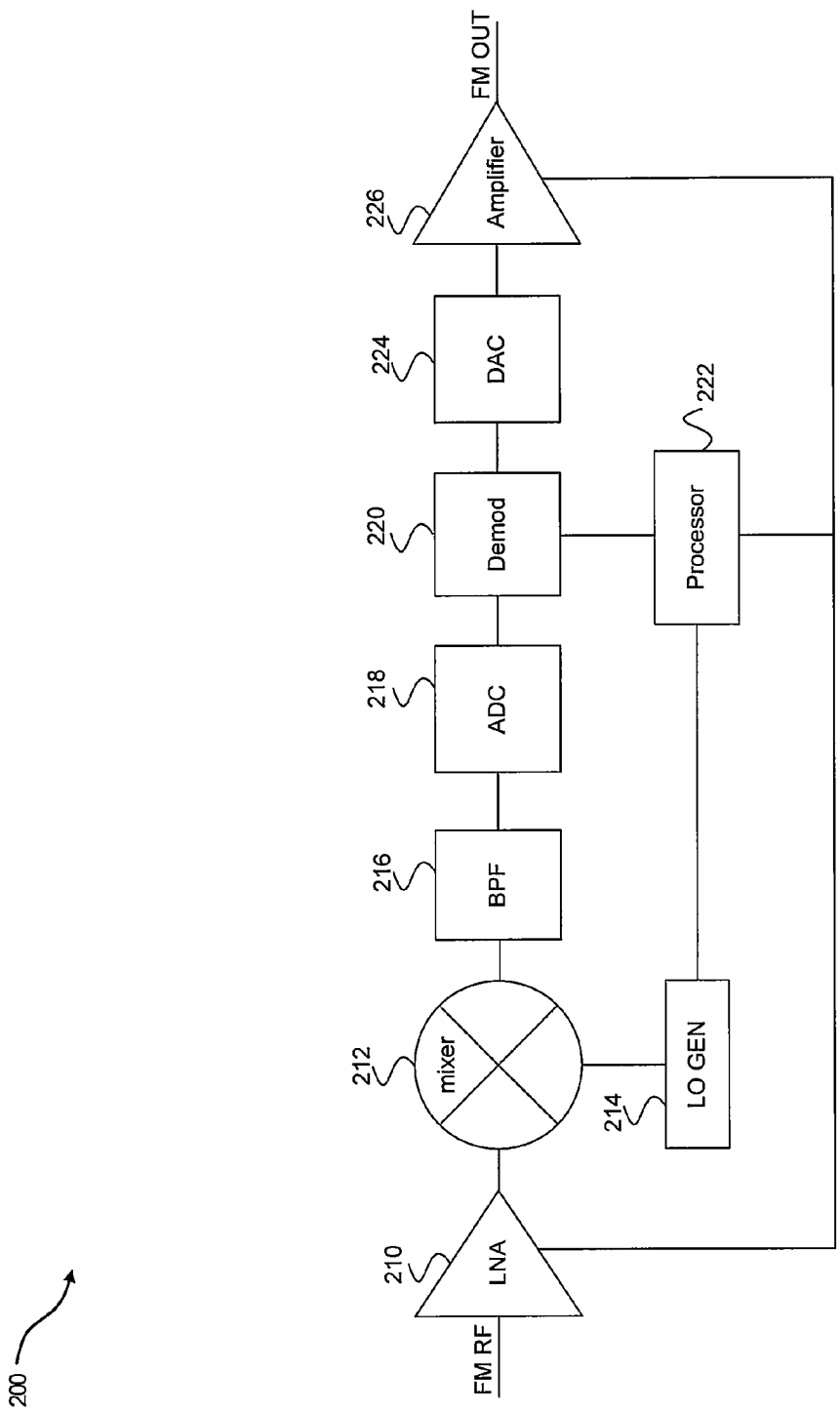
FIG. 2 is a block diagram illustrating an exemplary FM receiver front end, in accordance with an embodiment of the invention.

FIG. 2 is a block diagram illustrating an exemplary FM receiver front end, in accordance with an embodiment of the invention. Referring to FIG. 2, there is shown FM receiver front end 200 comprising amplifiers 210 and 226, a mixer 212, an intermediate frequency local oscillator (IF LO) 214, a bandpass filter (BPF) 216, an analog to digital converter (ADC) 218, an FM demodulator 220, a digital to analog converter (DAC) 224 and a digital IF processor (DIP) 222.

The amplifiers 210 and 226 may comprise suitable circuitry, logic, and/or code that may be adapted to amplify input signals and output the amplified signals. The amplifier 210 and/or the amplifier 226 may be a low noise amplifier (LNA). A LNA may be utilized in instances where the signal to noise ratio (SNR) may be relatively low, such as, for example, RF signals received by an antenna. The amplifiers 210 and 226 may also be variable gain amplifiers, where the gain control may be under the programmable control of a processor, such as the DIP 222.

The mixer 212 may comprise suitable circuitry, logic, and/or code that may be adapted to receive as inputs two signals, and generate an output signal, which may be a difference of the frequencies of the two input signals and/or a sum of the frequencies of the two input signals. The mixer 212 may receive as inputs, the output signal generated by the amplifier 210, and the output signal generated by the IF LO 214. The output of the mixer 212 may be communicatively coupled to the BPF 216.

The IF LO 214 may comprise suitable circuitry, logic, and/or code that may be adapted to output a signal of a specific frequency, either preset or variable under external control, where the external control may be a voltage. The latter type may be referred to as a voltage controlled oscillator (VCO). A VCO control voltage may be under programmable control of a processor, such as the DIP 222. In another embodiment of the invention the IF LO 214 may comprise a discrete digital frequency synthesizer (DDFS).

The BPF 216 may comprise suitable circuitry, logic, and/or code that may be adapted to selectively pass signals within a certain bandwidth while attenuating signals outside that bandwidth.

The FM demodulator 220 may comprise suitable circuitry, logic, and/or code that may enable demodulation of the digital IF FM signal generated by the ADC 218. The demodulation of the digital IF FM signal may generate a baseband signal which may comprise the original information signal intended for the FM receiver front end 200, such as audio signals or other information embedded into the FM signal. The downconversion of the digital IF signal to the digital baseband signal may utilize decimation filters where the input frequency of the decimation filter may be a multiple of the output frequency of the decimation filter.

The DIP 222 may comprise suitable circuitry, logic, and/or code that may be adapted to control the FM demodulator 220, the IF LO 214 and the amplifiers 210 and 216. The DIP 222 may extract desired data from the FM signal received by the amplifier 210, and may control the demodulation of the digitized IF FM signal generated by the ADC 218. The digital filtering of the digital samples may utilize, for example, a derotator that may use a coordinate rotation digital calculation (CORDIC) algorithm.

The DAC 224 may comprise suitable circuitry, logic, and/or code that may enable conversion of a digital input signal to an analog output signal. The DAC 224 may receive as an input, the demodulated digital IF signal generated by the FM demodulator 220 and may generate an analog output signal that may be communicated to the amplifier 226.

In operation, the FM signal, which may have a carrier frequency referred to as $f_{FM}$, may be received by an antenna and communicated to the amplifier 210, where the FM signal may be amplified by the amplifier 210, where the gain of the amplifier 210 may be adjusted based on the strength of the received FM signal. The amplified FM signal may be communicated to an input of the mixer 212. The output signal of the IF LO 214, which may have a frequency of $f_{LO}=f_{FM}+f_{IF}$ or $f_{LO}=f_{FM}-f_{IF}$, may be communicated to another input of the mixer 212, where $f_{IF}$ may be a desired intermediate frequency. The mixer 212 may process the two input signals such that the output signal may have a frequency, which may be a sum and/or a difference of the frequencies of the two input signals. The mixer 212 output signal may be referred to as an IF signal.

The IF signal may be communicated to the BPF 216, which may be adapted to pass the desired bandwidth of signals about the IF frequency $f_{IF}$, while attenuating the undesired frequencies in the IF signal. The filtered IF signal may be communicated to the ADC 218 where the filtered IF FM signal may be converted to a digital signal. The resulting digital signal may then be demodulated by the demodulator 220, and may be digitally filtered to remove artifacts of the digital down-conversion process before being re-converted to an analog signal by the DAC 224. The analog output signal of the DAC 224 may be amplified by the amplifier 226.

Figure 3:
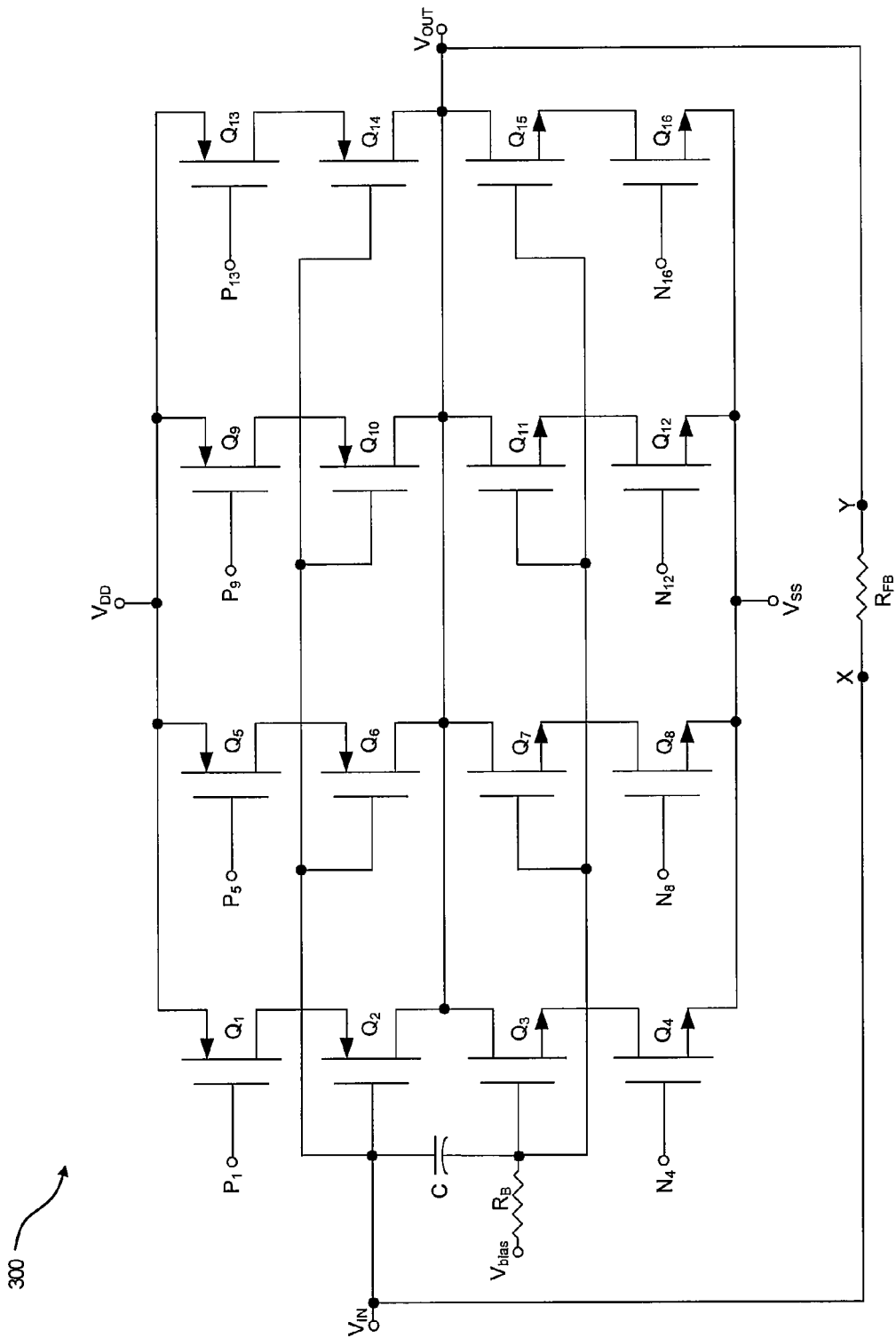
FIG. 3 is a block diagram illustrating an exemplary low noise amplifier circuit, in accordance with an embodiment of the invention.

FIG. 3 is a block diagram illustrating an exemplary low noise amplifier circuit, in accordance with an embodiment of the invention. Referring to FIG. 3, there is shown LNA circuit 300 comprising PMOS transistors $Q_1$, $Q_2$, $Q_5$, $Q_6$, $Q_9$, $Q_{10}$, $Q_{13}$ and $Q_{14}$, NMOS transistors $Q_3$, $Q_4$, $Q_7$, $Q_8$, $Q_{11}$, $Q_{12}$, $Q_{15}$ and $Q_{16}$, bias voltage $V_{bias}$, supply voltages $V_{DD}$ and $V_{SS}$, bias resistance $R_B$, feedback resistance $R_{FB}$ and capacitor C. There is also shown input terminals $P_1$, $P_5$, $P_9$, $P_{13}$, $N_4$, $N_8$, $N_{12}$, $N_{16}$, $V_{IN}$ and output terminal $V_{OUT}$.

Each vertical column of transistors, such as the PMOS transistors Q1 and Q2 and NMOS transistors Q3 and Q4 may comprise a gain stage of the amplifier, with four stages shown in the exemplary LNA circuit 300. Each stage may comprise transistors with a specific multiplication factor, determined by transistor size, for example, that may be different from the multiplication factors of the transistors in the other stages. Thus the gain and power level of each stage may differ from the other stages. The invention is not limited to the number of stages shown in FIG. 3, and as such may comprise any number of stages depending on the required gain levels and power requirements of the LNA circuit 300.

The source terminals of the PMOS transistors $Q_1$, $Q_5$, $Q_9$ and $Q_{13}$ may be coupled to the supply voltage $V_{DD}$, and the source terminals of the NMOS transistors $Q_4$, $Q_8$, $Q_{12}$ and $Q_{16}$ may be coupled to the supply voltage $V_{SS}$. The gate terminals of PMOS transistors $Q_2$, $Q_6$, $Q_{10}$ and $Q_{14}$ may be coupled together and may comprise the input terminal for the LNA circuit 300, denoted by $V_{IN}$ in FIG. 3. The input terminal $V_{IN}$ may be AC coupled to the common gate terminals of the NMOS transistors $Q_3$, $Q_7$, $Q_{11}$ and $Q_{15}$ by the capacitor C. A terminal of the bias resistor $R_B$ may also be coupled to the common gate terminals of the transistors $Q_3$, $Q_7$, $Q_{11}$ and $Q_{15}$, with the other terminal of the bias resistor $R_B$ comprising the input terminal $V_{bias}$.

The PMOS transistors $Q_1$, $Q_5$, $Q_9$ and $Q_{13}$ and the NMOS transistors $Q_4$, $Q_8$, $Q_{12}$, $Q_{16}$ may comprise switches that may be enabled to activate a particular stage of the LNA circuit 300. The gate terminals of the transistors $Q_1$, $Q_5$, $Q_9$, $Q_{13}$ $Q_4$, $Q_8$, $Q_{12}$, and $Q_{16}$ may comprise the input terminals $P_1$, $P_5$, $P_9$, $P_{13}$, $N_4$, $N_8$, $N_{12}$, $N_{16}$ and may be biased to activate the switches. For example, if the gate terminals of PMOS transistor $Q_1$ and the NMOS transistor $Q_4$ may be biased in the on state, the first gain stage comprising the transistors $Q_2$ and $Q_3$ may be enabled.

The output terminal of the LNA circuit 300, indicated by $V_{OUT}$ in FIG. 3, may comprise the common node defined by the drain terminals of the PMOS transistors $Q_2$, $Q_6$, $Q_{10}$ and $Q_{14}$ and the NMOS transistors $Q_3$, $Q_7$, $Q_{11}$ and $Q_{15}$. The feedback resistor, $R_{FB}$, may couple the output terminal, $V_{OUT}$, to the input terminal $V_{IN}$ of the LNA circuit 300, and is delineated between the nodes X and Y. The feedback resistor $R_{FB}$, may be adjustable and is described further with respect to FIG. 4.

In operation, bias and supply voltages may be applied to the LNA circuit 300 at $V_{bias}$, $V_{DD}$ and $V_{SS}$. The bias voltage $V_{bias}$ may be adjusted to bias the NMOS transistors $Q_3$, $Q_7$, $Q_{11}$ and $Q_{15}$ at a desired voltage, the midpoint between $V_{DD}$ and $V_{SS}$, for example. The input terminals $P_1$, $P_5$, $P_9$, $P_{13}$, $N_4$, $N_8$, $N_{12}$, $N_{16}$ may be biased at appropriate voltages to activate desired gain stages. For example, if the input terminals $P_1$, $P_5$, $P_9$, $P_{13}$ are asserted low and the input terminals $N_4$, $N_8$, $N_{12}$, $N_{16}$ are asserted high, the transistors $Q_1$, $Q_5$, $Q_9$, $Q_{13}$ $Q_4$, $Q_8$, $Q_{12}$ and $Q_{16}$ may be switched on and all four gain stages may be enabled. Thus, in instances where an input signal may be communicated to the input terminal $V_{IN}$, an amplified version of the input signal may be generated at the output terminal, $V_{OUT}$.

The gain of the LNA circuit 300 may be adjusted by enabling and/or disabling gain stages by applying appropriate input voltages at the input terminals $P_1$, $P_5$, $P_9$, $P_{13}$, $N_4$, $N_8$, $N_{12}$, $N_{16}$. A challenge in adjusting the gain of an amplifier may be the variation of the input impedance. For an amplifier with resistive feedback, if the output impedance of the amplifier transistors may be large compared to the feedback resistance, which may be typical, the low-frequency input resistance, $R_i$, may be calculated from the following equation:

$$R_i = \frac{1}{g_{mp} + g_{mn}}$$

where $g_{mp}$ and $g_{mn}$ are the transconductance values of PMOS and NMOS devices, respectively. Therefore, for a given current, the input resistance may remain essentially constant with feedback resistance $R_{FB}$.

The gain of the LNA circuit 300, utilizing the same assumption, may be determined by the following:

$$g = -R_{FB} * (g_{mp} + g_{mn}) = \frac{-R_{FB}}{R_i}$$

Thus, the gain may be adjusted by adjusting the feedback resistance $R_{FB}$, while the input resistance, $R_i$, may remain constant as shown in the previous equation.

In this manner, the gain of the LNA circuit 300 may be adjusted either by adjusting the feedback resistance $R_{FB}$, or by switching selected gain stages on or off, which may result in a large range of possible gain values. The gain of each gain stage may be twice as high as the preceding stage, and half that of the next stage, thus creating a binary weighted scheme for the gain stages.

With a plurality of enabled gain stages, the total transconductance may be considered a sum of the individual transconductances, and higher transconductance may result in higher gain and a lower noise figure. Adjusting the feedback resistance $R_{FB}$, may adjust the gain of the LNA circuit 300, as described above, but may not affect the power and the input impedance. The input impedance may be affected by the NMOS and PMOS transconductances of the LNA circuit 300, so by enabling and/or disabling selected gain stages, the input impedance may be adjusted. Thus, the gain stages may be designed to provide impedance match with an input device, such as a 50 ohm antenna, for example.

Switching gain stages on and off may change the power usage of the LNA circuit 300, such that the RF receiver 153a may utilize less power when desired. For example, in instances when a large input signal may be present, lower gain may be necessary so that gain stages may be disabled, resulting in reduced power drain.

Exemplary performance parameters comprising gain, noise figure, input impedance and power of the LNA circuit 300 may be adjusted by enabling selected gain stages and adjusting the feedback resistance $R_{FB}$. The range of values utilized to obtain the array of performance characteristics may be stored in a lookup table in the memory 157, for example, described with respect to FIG. 1.

Figure 4:
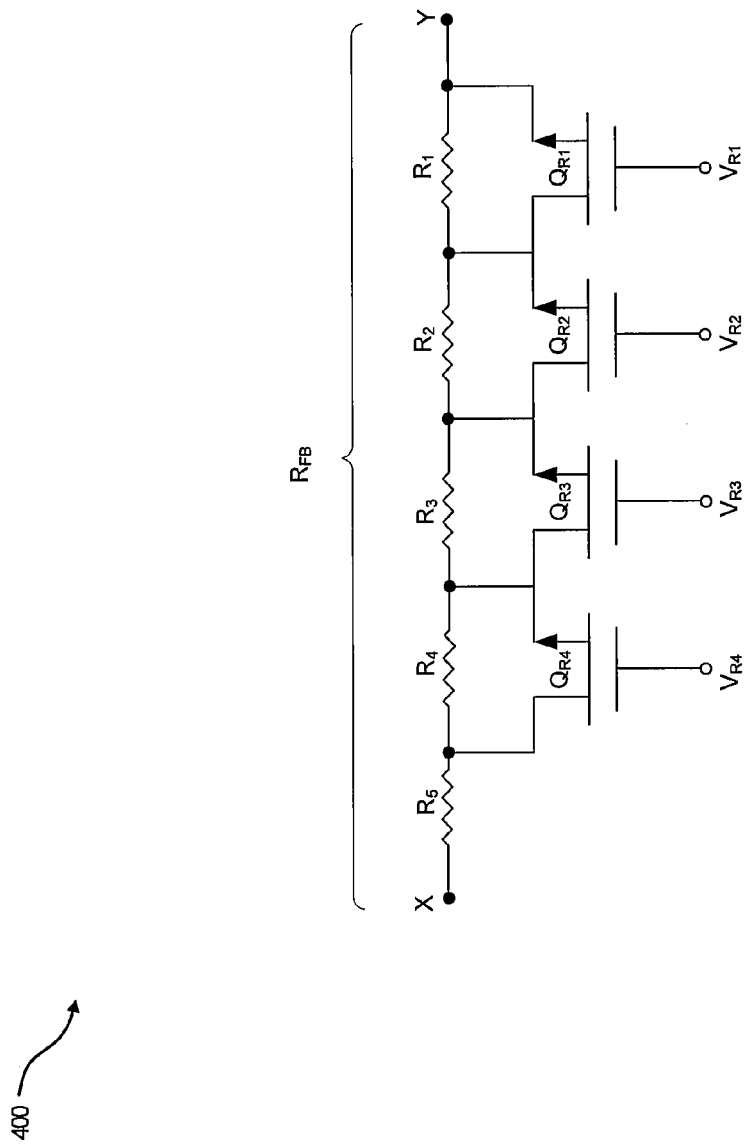
FIG. 4 is a block diagram illustrating an adjustable feedback resistance circuit, in accordance with an embodiment of the invention.

FIG. 4 is a block diagram illustrating an adjustable feedback resistance circuit, in accordance with an embodiment of the invention. Referring to FIG. 4, there is shown feedback resistance circuit 400 comprising NMOS transistors $Q_{R1}$, $Q_{R2}$, $Q_{R3}$ and $Q_{R4}$ and resistors $R_1$, $R_2$, $R_3$ $R_4$ and $R_5$. There is also shown input terminals $V_{R1}$, $V_{R2}$, $V_{R3}$ and $V_{R4}$. The feedback resistance, $R_{FB}$, may be defined as the resistance between the nodes X and Y, which may correspond to the nodes X and Y described with respect to FIG. 3.

In instances where the transistors $Q_{R1}$, $Q_{R2}$, $Q_{R3}$ and $Q_{R4}$ may not be enabled, or switched on, the feedback resistance $R_{FB}$ between the nodes X and Y, may comprise the series combination of the resistors $R_1$, $R_2$, $R_3$ $R_4$ and $R_5$. The resistance value of each resistor of $R_1$, $R_2$, $R_3$, $R_4$ and $R_5$ may be twice that of the next resistor and half that of the preceding resistor. For example, $R_1$ may be 1000 ohms, $R_2$ may be 500 ohms and $R_3$ may be 250 ohms, thus creating a binary weighted scheme for the feedback resistance $R_{FB}$.

The node X may comprise one terminal of the resistor $R_5$ and the other terminal of the resistor $R_5$ may be coupled to a terminal of the resistor $R_4$ and the drain terminal of the transistor $Q_{R4}$. The gate terminals of the transistors $Q_{R1}$, $Q_{R2}$, $Q_{R3}$ and $Q_{R4}$ may comprise the input terminals $V_{R1}$, $V_{R2}$, $V_{R3}$ and $V_{R4}$.

The node Y of the feedback resistance circuit 400 may comprise one terminal of the resistor $R_1$ and the source terminal of the transistor $Q_{R1}$. The drain terminal of the transistor $Q_{R1}$ may be coupled to the other terminal of the resistor $R_1$, a terminal of the resistor $R_2$ and the source terminal of the transistor $Q_{R2}$. This connection scheme, with the drain and source terminals of an NMOS transistor each coupled to a terminal of a resistor, in series with the next resistor/transistor pair, is repeated for resistors $R_2$ to $R_4$. The invention is not limited to the number of resistors illustrated in FIG. 4. Accordingly, any number of resistor/transistor pairs may be utilized depending on the desired resistance values and die size constraints, for example.

In operation, the input terminals $V_{R1}$, $V_{R2}$, $V_{R3}$, and $V_{R4}$ may be utilized to adjust the resistance of the feedback resistance circuit 400. The input terminals $V_{R1}$, $V_{R2}$, $V_{R3}$ and $V_{R4}$ may be utilized to bypass the associated resistor $R_1$, $R_2$, $R_3$ and/or $R_4$ in the circuit. For example, applying a high signal to $V_{R1}$ may switch on the transistor $Q_{R1}$, effectively bypassing the resistor $R_1$. The type of transistors utilized for the transistors $Q_{R1}$, $Q_{R2}$, $Q_{R3}$ and $Q_{R4}$ may be selected to result in a minimum drain to source impedance, thus creating a minimum impedance short of a resistor when a given transistor may be switched on. In this manner, any combination of the series resistors may be enabled and/or disabled to obtain a desired resistance.

The multiple resistance values and LNA circuit 300 gain values made possible by enabling or disabling resistors in the feedback resistance circuit 400 may be stored in a lookup table in the memory 157, for example, described with respect to FIG. 1.

Figure 5:
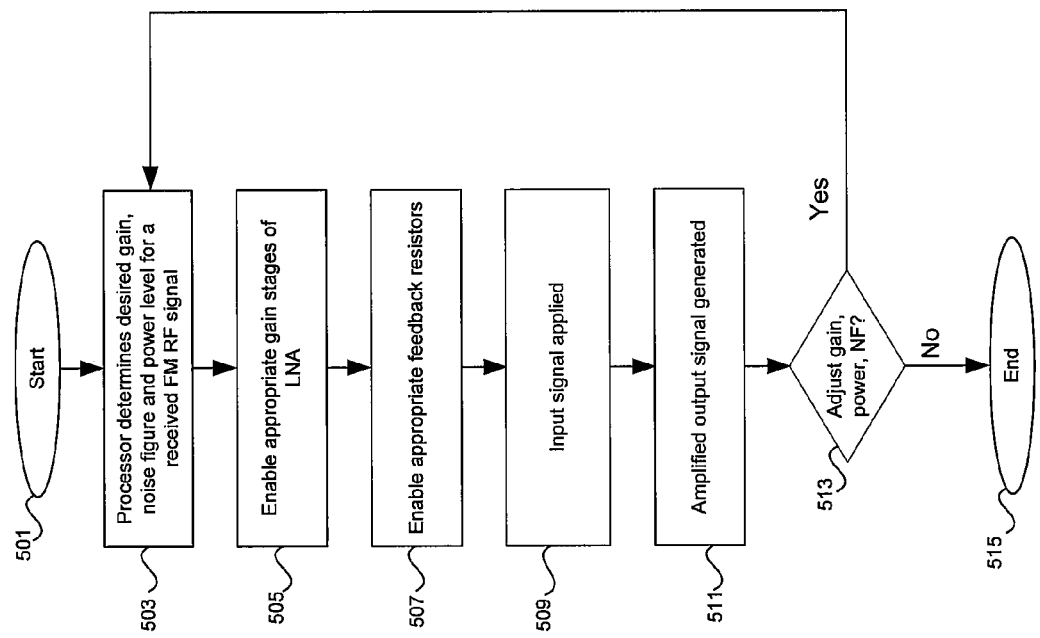
FIG. 5 is a flow diagram illustrating an exemplary broadband low noise amplifier control process, in accordance with an embodiment of the invention.

FIG. 5 is a flow diagram illustrating an exemplary broadband low noise amplifier control process, in accordance with an embodiment of the invention. Referring to FIG. 5, following start step 501, in step 503, a processor, such as the digital IF processor 222, may determine the desired gain, noise figure and power level of the amplifier 210 based on a received FM RF signal. In step 505, the processor 222 may enable appropriate gain stages based on prestored gain values in a lookup table stored in the memory 157, for example. In step 507, the DIP 222 may enable appropriate resistors to set an appropriate gain. The gain values versus the feedback resistance $R_{FB}$ may also be stored in a lookup table. In step 509, the input signal may be applied to the amplifier 210, and in step 511 an amplified output signal may be generated. In step 513, if it is desired to adjust the gain, power and/or noise factor, the process may step back to step 503 to restart the gain adjustment process, and if not may proceed to end step 515.

In an exemplary embodiment of the invention, a method and system are disclosed for controlling gain, power and/or noise figure by selectively enabling one or more of a plurality of gain stages by activating one or more of a plurality of pairs of switching transistors. Each of the gain stages may comprise complementary inverter pairs $Q_2/Q_3$, $Q_6/Q_7$, $Q_{10}/Q_{11}$ and $Q_{14}/Q_{15}$, with the gain of each of the gain stages being binary weighted and stored in a lookup table. A feedback resistance, $R_{FB}$, coupled across the gain stages may be adjusted, and may comprise a plurality of individually addressable resistors, $R_1$, $R_2$, $R_3$ and $R_4$, with the resistance values being binary weighted and stored in a lookup table. The adjusting of the feedback resistance may comprise switching one or more of a plurality of switching transistors, $Q_{R1}$, $Q_{R2}$, $Q_{R3}$ and $Q_{R4}$, each connected in parallel with one of the individually addressable resistors, which may shunt one or more of the individually addressable resistors when enabled.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for signal amplification, the method comprising:
   controlling gain, power and/or a noise figure of a low noise amplifier by selectively enabling one or more of a plurality of gain stages in said low noise amplifier; and
   adjusting a feedback resistance coupled across said plurality of gain stages, wherein each of said plurality of gain stages comprises complementary inverter pairs.

2. A method for signal amplification, the method comprising:
   controlling gain, power and/or a noise figure of a low noise amplifier by selectively enabling one or more of a plurality of gain stages in said low noise amplifier;
   adjusting a feedback resistance coupled across said plurality of gain stages; and
   configuring a gain of each of said plurality of gain stages based on data stored in a lookup table.

3. A method for signal amplification, the method comprising:
   controlling gain, power and/or a noise figure of a low noise amplifier by selectively enabling one or more of a plurality of gain stages in said low noise amplifier; and
   adjusting a feedback resistance comprising a plurality of binary weighted, individually addressable resistors coupled across said plurality of gain stages.

4. A method for signal amplification, the method comprising:
   controlling gain, power and/or a noise figure of a low noise amplifier by selectively enabling one or more of a plurality of gain stages in said low noise amplifier;
   adjusting a feedback resistance comprising a plurality of individually addressable resistor coupled across said plurality of gain stages; and
   storing a resistance of each of said individually addressable resistors in a lookup table.

5. A method for signal amplification, the method comprising:
   controlling gain, power and/or a noise figure of a low noise amplifier by selectively enabling one or more of a plurality of gain stages in said low noise amplifier;
   adjusting a feedback resistance comprising a plurality of individually addressable resistors coupled across said plurality of gain stages, wherein:
      said adjusting of said feedback resistance comprises switching one or more of a plurality of switching transistors connected in parallel with each of said individually addressable resistors; and
      said switching shunts said select one or more of said individually addressable resistors.

6. A system for signal amplification, the system comprising:
   one or more circuits that controls gain, power and/or a noise figure of a low noise amplifier by selectively enabling one or more of a plurality of gain stages in said low noise amplifier; and
   said one or more circuits adjusts a feedback resistance coupled across said plurality of gain stages, wherein each of said plurality of gain stages comprises complementary inverter pairs.

7. A system for signal amplification, the system comprising:
   one or more circuits that controls gain, power and/or a noise figure of a low noise amplifier by selectively enabling one or more of a plurality of gain stages in said low noise amplifier;
   said one or more circuits adjusts a feedback resistance coupled across said plurality of gain stages; and
   said one or more circuits enables configuration of a gain of each of said plurality of gain stages based on data stored in a lookup table.

8. A system for signal amplification, the system comprising:
   one or more circuits that controls gain, power and/or a noise figure of a low noise amplifier by selectively enabling one or more of a plurality of gain stages in said low noise amplifier; and
   said one or more circuits adjusts a feedback resistance coupled across said plurality of gain stages, wherein said feedback resistance comprises a plurality of binary weighted, individually addressable resistors.

9. A system for signal amplification, the system comprising:
   one or more circuits that controls gain, power and/or a noise figure of a low noise amplifier by selectively enabling one or more of a plurality of gain stages in said low noise amplifier;
   said one or more circuits adjusts a feedback resistance comprising a plurality of individually addressable resistors coupled across said plurality of gain stages; and
   said one or more circuits enables storing a resistance of each of said individually addressable resistors in a lookup table.

10. A system for signal amplification, the system comprising:

one or more circuits that controls gain, power and/or a noise figure of a low noise amplifier by selectively enabling one or more of a plurality of gain stages in said low noise amplifier;

said one or more circuits adjusts a feedback resistance comprising a plurality of individually addressable resistors coupled across said plurality of gain stages; and said one or more circuits enables switching one or more of a plurality of switching transistors, wherein one of said plurality of transistors is connected in parallel with each of said individually addressable resistors, wherein said switching shunts said select one or more of said individually addressable resistors.

* * * * *